United States Patent
Chooi et al.

[11] Patent Number: 6,069,069
[45] Date of Patent: May 30, 2000

[54] METHOD FOR PLANARIZING A LOW DIELECTRIC CONSTANT SPIN-ON POLYMER USING NITRIDE ETCH STOP

[75] Inventors: Simon Yew-Meng Chooi; Jia Zhen Zheng, both of Singapore, Singapore; Lap Chan, San Francisco, Calif.

[73] Assignee: Chartered Semiconductor Manufacturing, Ltd., Singapore, Singapore

[21] Appl. No.: 08/767,009

[22] Filed: Dec. 16, 1996

[51] Int. Cl.$^7$ ................................................. H01L 21/4763
[52] U.S. Cl. ........................ 438/634; 438/631; 438/642; 438/760; 438/778
[58] Field of Search ........................................... 438/631, 632, 438/633, 634, 636, 642, 645, 646, 647, 760, 761, 778, 780; 257/760

[56] References Cited

U.S. PATENT DOCUMENTS

| | | | |
|---|---|---|---|
| 5,003,062 | 3/1991 | Yen | 438/761 |
| 5,246,884 | 9/1993 | Jaso et al. | 438/693 |
| 5,262,346 | 11/1993 | Bindal et al. | 438/634 |
| 5,324,690 | 6/1994 | Gelatos et al. | 438/437 |
| 5,362,669 | 11/1994 | Boyd et al. | 438/404 |
| 5,385,866 | 1/1995 | Bartush | 438/595 |
| 5,444,026 | 8/1995 | Kim et al. | 438/760 |
| 5,503,882 | 4/1996 | Dawson | 438/763 |
| 5,534,457 | 7/1996 | Tseng et al. | 438/254 |
| 5,563,104 | 10/1996 | Jang et al. | 438/761 |
| 5,656,556 | 8/1997 | Yang | 438/646 |
| 5,681,425 | 10/1997 | Chen | 438/631 |
| 5,858,870 | 1/1999 | Zheng et al. | 438/622 |
| 5,880,018 | 3/1999 | Boeck et al. | 438/619 |

*Primary Examiner*—Carl Whitehead, Jr.
*Assistant Examiner*—Khanh Duong
*Attorney, Agent, or Firm*—George O. Saile; Rosemary L.S. Pike

[57] ABSTRACT

A method for preserving the integrity of the underlying metal lines during planarization by inserting a nitride layer as an etch stop in an oxide-nitride-oxide dielectric layer underlying a spin-on polymer is described. Semiconductor device structures are provided in and on a semiconductor substrate. A conducting layer is deposited overlying the surfaces of the semiconductor device structures and patterned to form conducting lines wherein a gap is formed between the conducting lines. A first dielectric layer is deposited over the surfaces of the conducting lines wherein the first dielectric layer contains an etch stop layer wherein the gap remains between the conducting lines. A second dielectric layer is deposited overlying the first dielectric layer wherein the gap is filled by the second dielectric layer. The second dielectric layer is etched back so that the second dielectric layer remains only within the gap wherein the etch stop layer preserves the integrity of the underlying conducting lines. A third dielectric layer is deposited over the first and second dielectric layers and planarized. Alternatively, instead of etching back the second dielectric layer, chemical mechanical polishing (CMP) is used to planarize the layer wherein the etch stop acts as a CMP stop. A third dielectric layer is then deposited over the substrate to complete fabrication of the integrated circuit device.

26 Claims, 4 Drawing Sheets

METHOD FOR PLANARIZING A LOW DIELECTRIC CONSTANT SPIN-ON POLYMER USING NITRIDE ETCH STOP

RELATED PATENT APPLICATION

U.S. patent application Ser. No. 08/767,008 filed on Dec. 16, 1996 to J. Z. Zheng et al, now U.S. Pat. No. 5,858,870 issued on Jan. 12, 1999.

BACKGROUND OF THE INVENTION (1) Field of the Invention

The present invention relates to the fabrication of integrated circuit devices, and more particularly, to a method of preserving the integrity of a spin-on polymer gap filling material during planarization of a dielectric layer in the fabrication of integrated circuits.

(2) Description of the Prior Art

The new generation of low dielectric constant organic and inorganic silsesquioxane spin-on polymers have the unique property of thermal reflow that improves the planarity and gap filling characteristics of the interlayer dielectric. The thermal reflow property is more pronounced top of thin metal lines than on wide or large metal features. That is, the spin-on polymer will reflow away from the thin metal lines of less than about 10 microns in width and collect between the lines, but the polymer will remain over the wide metal lines of more than about 10 microns in width. Reflow will also take place at the corners of the wide metal lines. Hence, once the spin-on polymer on the wide metal features is etched away, the current oxide to conventional polyoxide spin-on-glass selectivity for planarization etchback can no longer ensure the preservation of the integrity of the underlying oxide barrier and the thin metal lines. This problem is illustrated in FIGS. 1 and 2.

Referring now more particularly to FIG. 1, there is illustrated a partially completed integrated circuit device. Semiconductor device structures, not shown, may be fabricated in and on the semiconductor substrate 10. Metal lines 20 are formed over insulating layer 11. Titanium nitride anti-reflective coating layer 22 is formed on the metal lines. An oxide 24 is conformally deposited over the pattern of metal lines 20. Spin-on polymer 26 is coated over the oxide layer. The conventional planarization etchback using $CHF_3/CF_4$ chemistry has a selectivity of oxide to the spin-on polymer of 1.6:1. As illustrated in FIG. 2, after etchback, the polymer over the wide metal line 31 has been etched away to the underlying oxide. The anti-reflective coating 22 has been etched away over the thin metal lines 33, exposing the metal 20.

Co-pending U.S. patent application Ser. No.08/767,008 (CS96-033) to J. Z. Zheng et al filed on Dec. 16, 1996 teaches a combination anti-reflective coating and polish stop layer to improve gap-filling and planarization of a dielectric layer. U.S. Pat. No. 5,262,348 to Bindal et al shows a method of forming nitride polish stops in the bottom of apertures. U.S. Pat. No. 5,362,669 to Boyd et al teaches forming a polish stop layer in the middle of a wide trench to prevent dishing. U.S. Pat. No. 5,324,690 to Gelatos et al teaches forming a ternary boron nitride film as a polish stop layer. U.S. Pat. No. 5,385,866 to Bartush teaches using an oxidized boron nitride polish stop layer. U.S. Pat. No. 5,246,884 to Jaso et al teaches a CVD diamond or diamond-like carbon polish stop layer.

SUMMARY OF THE INVENTION

Accordingly, it is a primary object of the invention to provide a process for improving the gap filling and planarization characteristics of the dielectric layer in the fabrication of integrated circuits.

It is a further object of the invention to provide a process for gap filling which uses silsesquioxane spin-on polymers.

It is yet another object to provide a process for improving the integrity of the underlying oxide and metal lines when planarizing a spin-on polymer dielectric layer.

Still another object of the invention is to insert a nitride layer as an etch stop in an oxide-nitride-oxide dielectric layer underlying a spin-on polymer to preserve the integrity of the underlying metal lines during planarization.

In accordance with the objects of the invention, a method for preserving the integrity of the underlying metal lines during planarization by inserting a nitride layer as an etch stop in an oxide-nitride-oxide dielectric layer underlying a spin-on polymer is achieved. Semiconductor device structures are provided in and on a semiconductor substrate. A conducting layer is deposited overlying the surfaces of the semiconductor device structures and patterned to form conducting lines wherein a gap is formed between the conducting lines. A first dielectric layer is deposited over the surfaces of the conducting lines wherein the first dielectric layer contains an etch stop layer wherein the gap remains between the conducting lines. A second dielectric layer is deposited overlying the first dielectric layer wherein the gap is filled by the second dielectric layer. The second dielectric layer is etched back so that the second dielectric layer remains only within the gap wherein the etch stop layer preserves the integrity of the underlying conducting lines. A third dielectric layer is deposited over the first and second dielectric layers. The third dielectric layer is planarized completing the fabrication of the integrated circuit device. Alternatively, instead of etching back the second dielectric layer, chemical mechanical polishing (CMP) is used to planarize the layer wherein the etch stop acts as a CMP stop. A third dielectric layer is then deposited over the planarized substrate to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
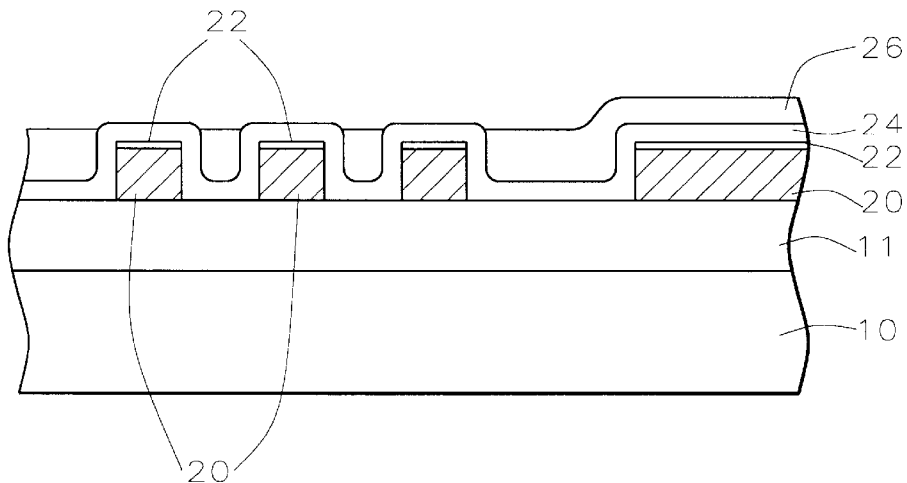
FIGS. 1 and 2 are cross-sectional representations of a process of the prior art.
Figure 2:
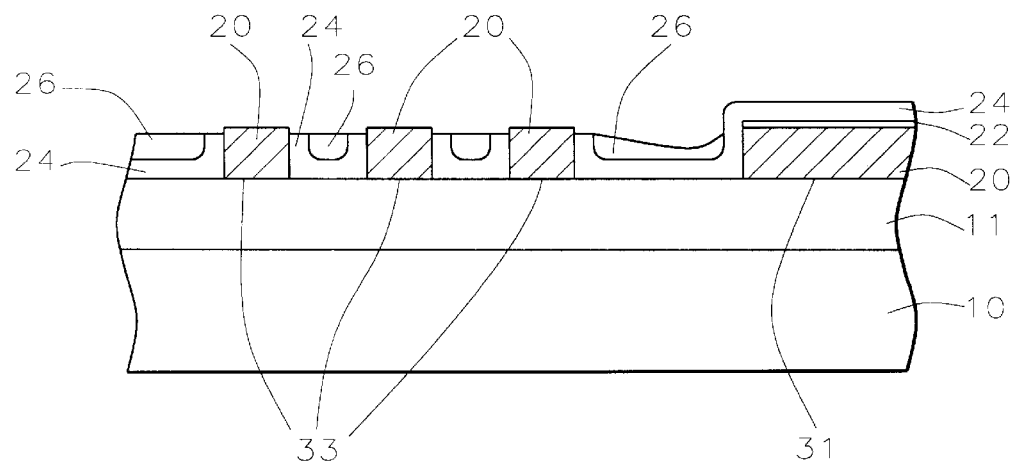
Figure 3:
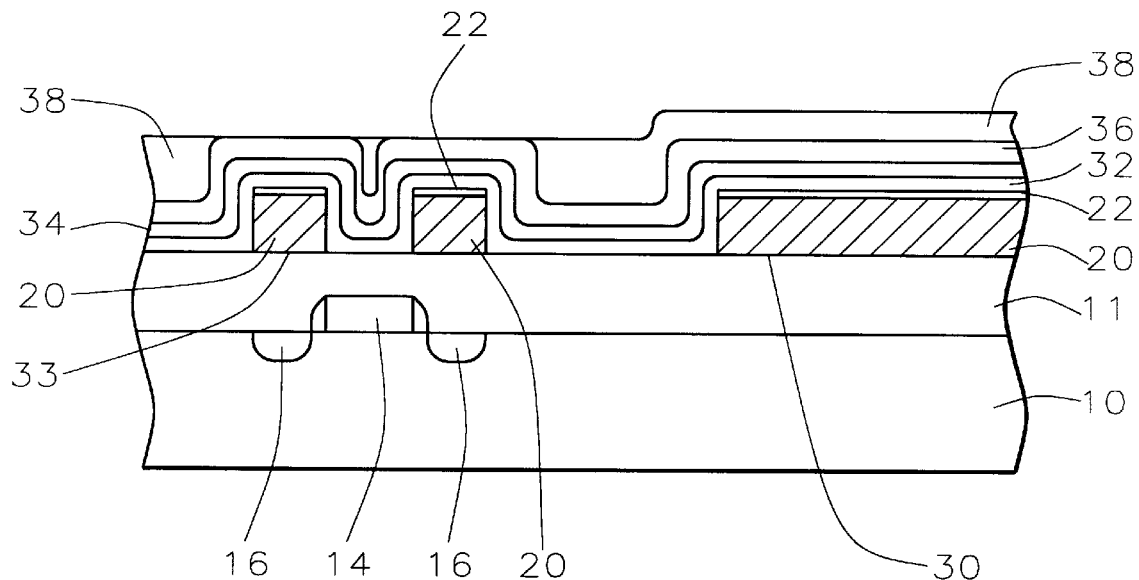
FIGS. 3 through 5 are cross-sectional representations of a first preferred embodiment of the present invention.
Figure 4:
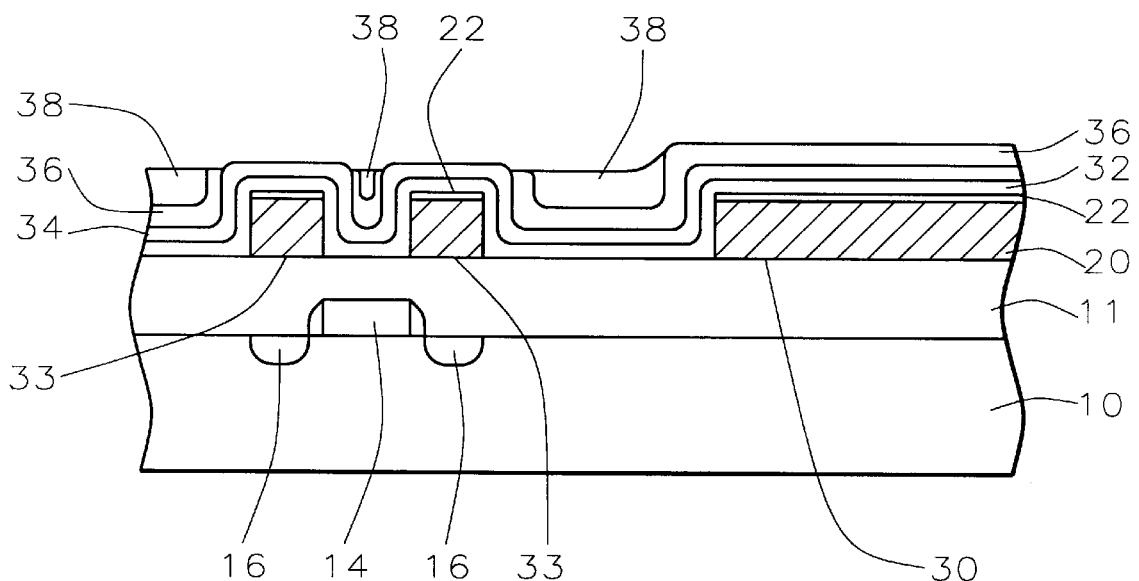
Figure 5:
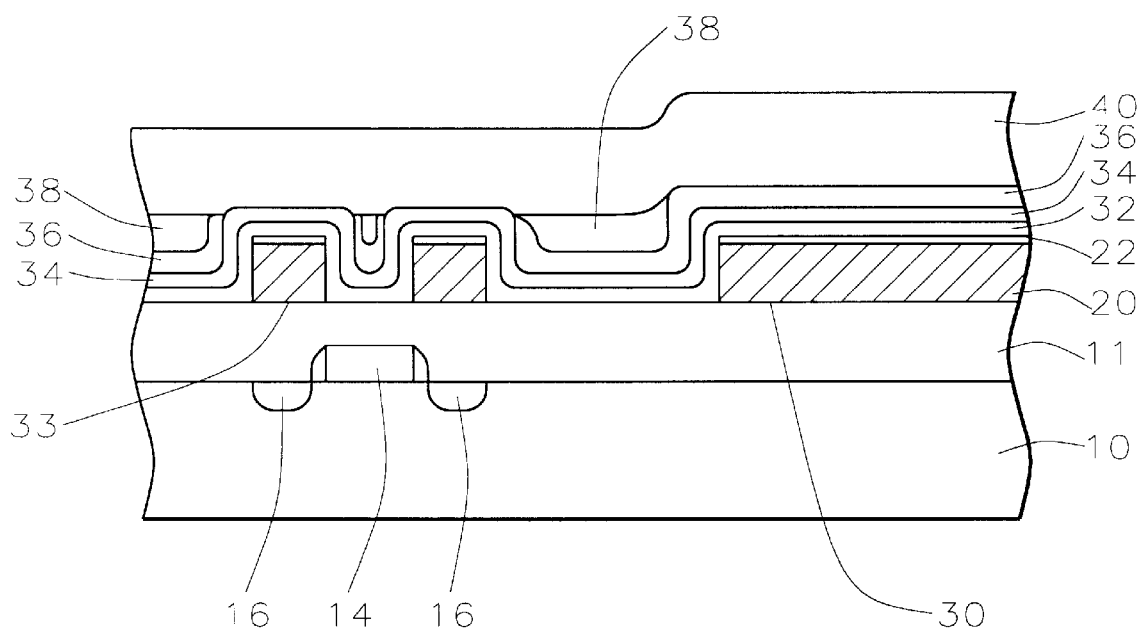

The process of the present invention will be described in detail with reference to FIGS. 3 through 8. FIGS. 3 through 5 illustrate a first preferred embodiment of the present invention. Referring now more particularly to FIG. 3, there is shown a semiconductor substrate 10, in which may be formed semiconductor device structures which may include a polysilicon gate electrode 14 and source and drain regions 16. An insulating layer 11 covers the semiconductor device structures. The insulating layer 11 is planarized such as by chemical mechanical polishing (CMP). A layer of conducting material 20 is deposited over the surface of the semiconductor substrate. The conducting material may be metal, such as Ti/TiN/Al-Cu, Ti/TiN/Ti/Al-Cu, or Ti/Al-Cu. An anti-reflective coating (ARC) 22 is formed over the conducting layer. The conducting layer 20 and ARC layer 22 are patterned to form conducting lines, as shown in FIG. 3.

An oxide-nitride-oxide dielectric layer is formed over the patterned conducting layer. A first thin oxide layer 32 is deposited over the conducting lines. This layer is deposited by plasma enhanced chemical vapor deposition (PECVD), sub-atmospheric chemical vapor deposition (SACVD), or high density plasma chemical vapor deposition (HDPCVD) to a thickness of between about 500 to 2000 Angstroms. A second nitride layer 34, comprising silicon nitride ($Si_3N_4$), silicon oxynitride, or boron nitride, is deposited by PECVD or low pressure chemical vapor deposition (LPCVD) over the first oxide layer to a thickness of between about 100 to 500 Angstroms. The nitride layer will act as an etch stop layer. A third oxide layer 36 is deposited by PECVD, SACVD, or HDPCVD over the nitride layer 34 to a thickness of between about 500 to 3000 Angstroms.

A low dielectric constant spin-on polymer 38 is coated over the oxide-nitride-oxide dielectric layer. The polymer may be an organic or inorganic silsesquioxane polymer. The polymer is deposited by spin-coating to a thickness of between about 3000 to 5500 Angstroms. Reflow occurs during the baking of the spin-on polymer which is done at a temperature of between about 100 and 200° C. for between about 5 and 120 seconds. The dielectric constant of spin-on polymers is typically between about 2.0 to 3.6. Typically, the dielectric constant of spin-on-glass is greater than 3.0. The process of the invention can apply to a coating of spin-on-glass rather than a spin-on polymer. However, spin-on-glass is not reflowable.

Referring now to FIG. 4, the spin-on polymer 38 is etched back using $CHF_3/CF_4$ chemistry having the appropriate selectivity. Those skilled in the art will be able to determine the appropriate selectivity by experimentation with $CHF_3/CF_4$ gas ratios of between about 0 and 20.

The spin-on polymer is etched back until it is removed from over the wide conducting lines 30; that is, those lines greater than about 10 microns in width. The nitride etch stop layer 34 prevents further etching of the thin conducting line stacks 33, less than about 10 microns in width.

Next, a thick oxide layer 40 is deposited and planarized, such as by chemical mechanical polishing (CMP), as shown in FIG. 5 to complete planarization of the interlayer dielectric layer.

Figure 6:
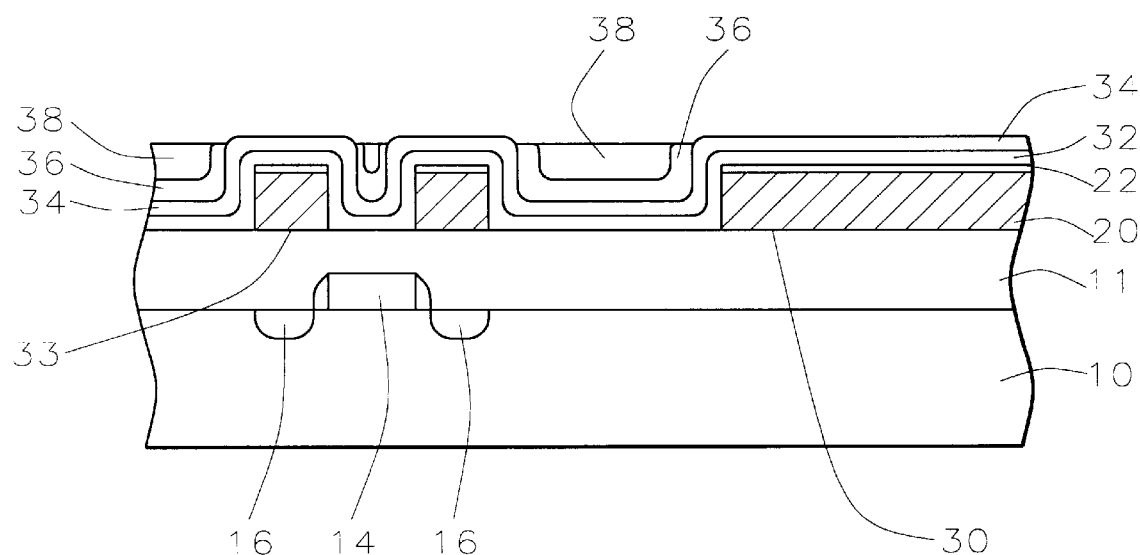
FIGS. 6 and 7 are cross-sectional representations of a second preferred embodiment of the present invention.
Figure 7:
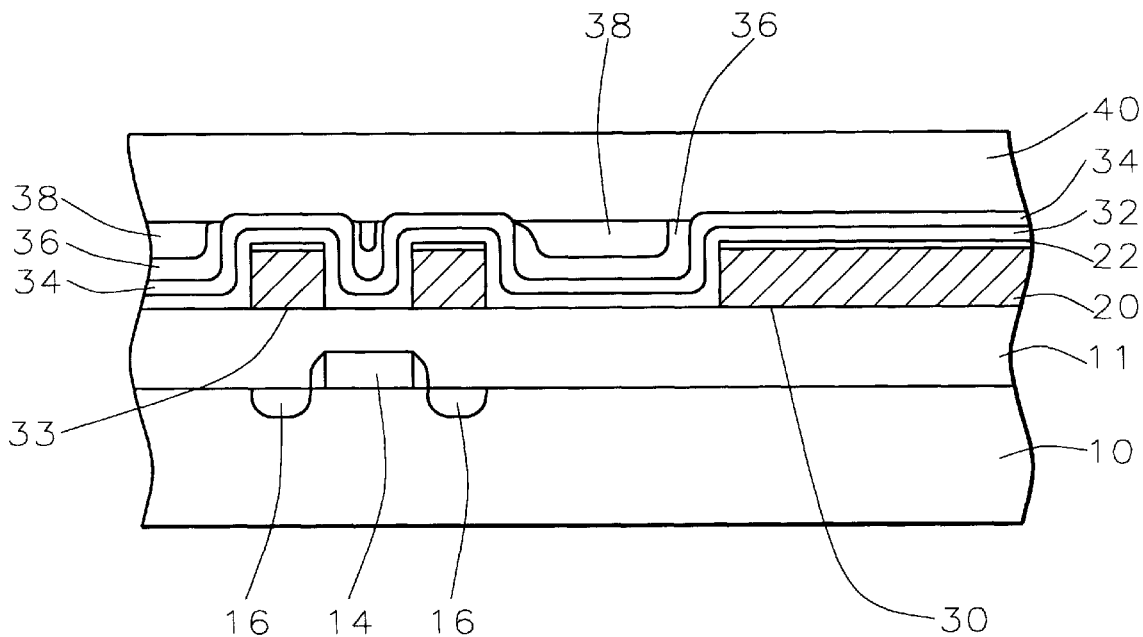

A second preferred embodiment of the present invention will be described with reference to FIGS. 6 and 7. Conducting lines are formed and the oxide-nitride-oxide dielectric layer is formed as is described with reference to FIG. 3. The spin-on polymer 38 is coated over the dielectric layer, as taught above. Instead of the etchback of the spin-on polymer illustrated in FIG. 4, FIG. 6 illustrates an alternative. The substrate is polished using chemical mechanical polishing (CMP). The nitride layer 34 acts as a CMP stop, resulting in the planarized substrate illustrated in FIG. 6. Finally, a thick layer of oxide 40 is deposited over the planarized substrate to a thickness of between about 3000 to 6000 Angstroms, as illustrated in FIG. 7 to complete the interlayer dielectric layer.

Figure 8:
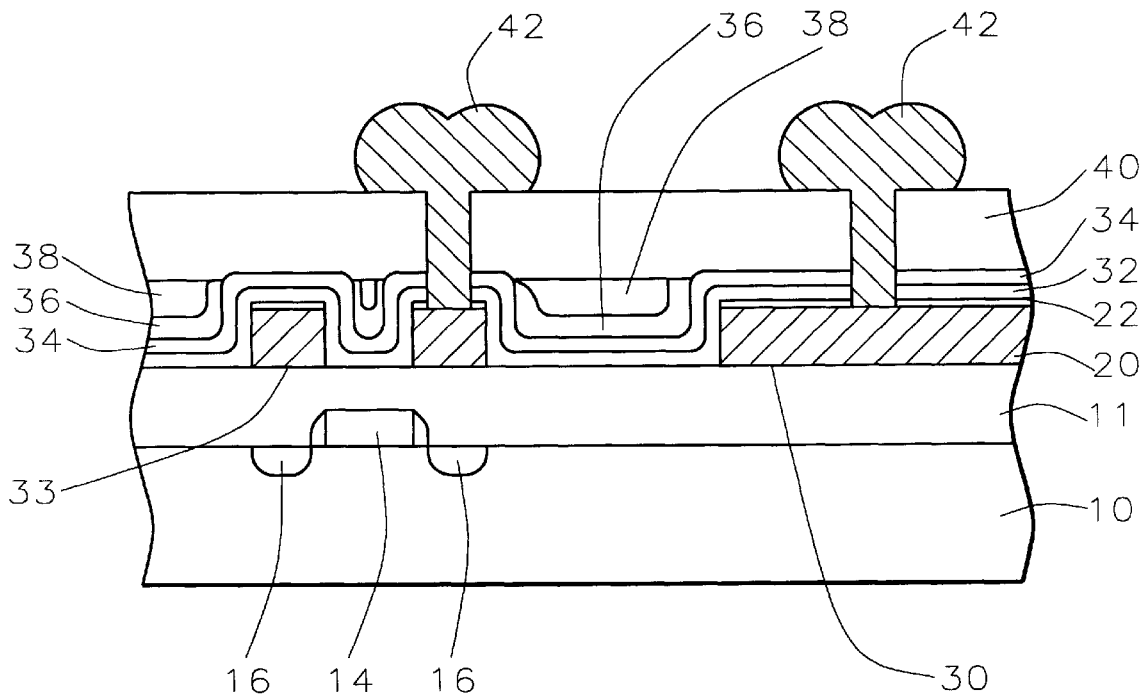
FIG. 8 is a cross-sectional representation of a completed integrated circuit device fabricated according to the method of the present invention.

After either the first or second embodiment of the invention, via openings may be etched through the dielectric layer to form desired electrical connections, for example to underlying semiconductor structures or to conducting lines 20, as shown in FIG. 8. The via openings are filled with a conducting material 42 which is patterned to complete fabrication of the integrated circuit device.

The process of the invention results in improved gap filling and improved planarity of the intermetal dielectric layer while preserving the integrity of the underlying dielectric layer and conducting lines.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:

providing semiconductor device structures in and on a semiconductor substrate;

depositing a conducting layer overlying the surfaces of said semiconductor device structures and patterning said conducting layer to form conducting lines wherein a gap is formed between said conducting lines;

depositing a first dielectric layer over the surfaces of said conducting lines wherein said first dielectric layer contains an etch stop layer wherein said gap remains between said conducting lines;

depositing a second dielectric layer overlying said first dielectric layer wherein said gap is filled by said second dielectric layer;

etching back said second dielectric layer so that said second dielectric layer remains only within said gap wherein said etch stop layer preserves the integrity of said underlying conducting lines;

depositing a third dielectric layer over said first and second dielectric layers; and planarizing said third dielectric layer completing the fabrication of said integrated circuit device.

2. The method according to claim 1 wherein said first dielectric layer comprises a first oxide layer having a thickness of between about 500 and 2000 Angstroms, said etch stop layer overlying said first oxide layer having a thickness of between about 100 and 1500 Angstroms and a second oxide layer overlying said etch stop layer having a thickness of between about 500 and 3000 Angstroms.

3. The method according to claim 1 wherein said etch stop layer comprises silicon oxynitride.

4. The method according to claim 1 wherein said etch stop layer comprises boron nitride.

5. The method according to claim 1 wherein said etch stop layer comprises silicon nitride.

6. The method according to claim 1 wherein said second dielectric layer comprises a spin-on polymer.

7. The method according to claim 1 wherein said second dielectric layer comprises an organic silsesquioxane spin-on polymer.

8. The method according to claim 1 wherein said second dielectric layer comprises an inorganic silsesquioxane spin-on polymer.

9. The method according to claim 1 wherein said second dielectric layer comprises a spin-on-glass material.

10. The method according to claim 1 wherein said planarizing is done by chemical mechanical polishing.

11. The method of manufacturing an integrated circuit device comprising:

providing semiconductor device structures in and on a semiconductor substrate;

covering said semiconductor device structures with an insulating layer;

depositing a first conducting layer overlying said insulating layer and patterning said first conducting layer to form conducting lines wherein a gap is formed between said conducting lines;

depositing a first dielectric layer over the surfaces of said conducting lines wherein said first dielectric layer contains an etch stop layer wherein said gap remains between said conducting lines;

depositing a second dielectric layer overlying said first dielectric layer wherein said gap is filled by said second dielectric layer;

planarizing said first and second dielectric layers wherein said etch stop preserves the integrity of said underlying conducting lines;

depositing a third dielectric layer over said planarized first and second dielectric layers;

etching via openings through said first, second, and third dielectric layers and said insulating layer to underlying said semiconductor device structures and to said conducting lines; and filling said via openings with a second conducting layer to complete electrical connections in the fabrication of said integrated circuit device.

12. The method according to claim 11 wherein said first dielectric layer comprises a first oxide layer having a thickness of between about 500 and 1000 Angstroms, said etch stop layer overlying said first oxide layer having a thickness of between about 100 and 1500 Angstroms and a second oxide layer overlying said etch stop layer having a thickness of between about 500 and 3000 Angstroms.

13. The method according to claim 11 wherein said etch stop layer comprises silicon oxynitride.

14. The method according to claim 11 wherein said etch stop layer comprises boron nitride.

15. The method according to claim 11 wherein said etch stop layer comprises silicon nitride.

16. The method according to claim 11 wherein said second dielectric layer comprises a spin-on polymer.

17. The method according to claim 11 wherein said second dielectric layer comprises an organic silsesquioxane spin-on polymer.

18. The method according to claim 11 wherein said second dielectric layer comprises an inorganic silsesquioxane spin-on polymer.

19. The method according to claim 11 wherein said planarizing is done by chemical mechanical polishing.

20. A method of manufacturing an integrated circuit device comprising:

providing a planarized insulating layer overlying semiconductor device structures in and on a semiconductor substrate;

depositing a conducting layer overlying said planarized insulating layer and patterning said conducting layer to form conducting lines wherein a gap is formed between said conducting lines;

depositing a first dielectric layer over the surfaces of said conducting lines wherein said gap remains between said conducting lines and wherein said first dielectric layer comprises a first oxide layer underlying a nitride etch stop layer underlying a second oxide layer;

depositing a second dielectric layer overlying said first dielectric layer wherein said gap is filled by said second dielectric layer;

etching back said second dielectric layer so that said second dielectric layer remains only within said gap wherein said etch stop layer preserves the integrity of said underlying conducting lines;

depositing a third dielectric layer over said first and second dielectric layers; and planarizing said third dielectric layer completing the fabrication of said integrated circuit device.

21. The method according to claim 20 wherein said etch stop layer comprises silicon oxynitride.

22. The method according to claim 20 wherein said etch stop layer comprises boron nitride.

23. The method according to claim 20 wherein said etch stop layer comprises silicon nitride.

24. The method according to claim 20 wherein said second dielectric layer comprises a spin-on polymer.

25. The method according to claim 20 wherein said second dielectric layer comprises an organic silsesquioxane spin-on polymer.

26. The method according to claim 20 wherein said second dielectric layer comprises an inorganic silsesquioxane spin-on polymer.

* * * * *